(12) United States Patent
Tardif et al.

(10) Patent No.: US 7,461,312 B2
(45) Date of Patent: Dec. 2, 2008

(54) DIGITAL SIGNATURE GENERATION FOR HARDWARE FUNCTIONAL TEST

(75) Inventors: John A. Tardif, San Jose, CA (US); Stephen Z. Au, San Jose, CA (US); Eiko Junus, San Jose, CA (US)

(73) Assignee: Microsoft Corporation, Redmond, WA (US)

( * ) Notice: Subject to any disclaimer, the term of this patent is extended or adjusted under 35 U.S.C. 154(b) by 426 days.

(21) Appl. No.: 10/897,058

(22) Filed: Jul. 22, 2004

(65) Prior Publication Data

US 2006/0020860 A1     Jan. 26, 2006

(51) Int. Cl.
*G01R 31/28* (2006.01)

(52) U.S. Cl. .................. 714/732; 714/45; 714/716; 714/733; 714/724; 714/734; 714/750; 714/718

(58) Field of Classification Search .......... 714/724, 714/726, 728, 729, 732, 735, 736, 738, 739, 714/741, 733, 734, 750, 45, 718, 716; 371/22.1, 371/27

See application file for complete search history.

(56) References Cited

U.S. PATENT DOCUMENTS

| | | | | |
|---|---|---|---|---|
| 4,601,033 A | * | 7/1986 | Whelan | 714/732 |
| 4,801,870 A | * | 1/1989 | Eichelberger et al. | 714/736 |
| 5,383,143 A | * | 1/1995 | Crouch et al. | 708/254 |
| 5,412,665 A | * | 5/1995 | Gruodis et al. | 714/739 |
| 5,416,783 A | * | 5/1995 | Broseghini et al. | 714/728 |
| 5,488,615 A | * | 1/1996 | Kunoff et al. | 714/732 |
| 5,784,383 A | | 7/1998 | Meaney | |
| 6,249,893 B1 | * | 6/2001 | Rajsuman et al. | 714/741 |
| 6,311,311 B1 | | 10/2001 | Swaney et al. | |
| 6,490,702 B1 | | 12/2002 | Song et al. | |
| 6,587,963 B1 | * | 7/2003 | Floyd et al. | 714/25 |
| 6,671,839 B1 | * | 12/2003 | Cote et al. | 714/726 |
| 6,684,357 B2 | * | 1/2004 | Im | 714/732 |
| 6,782,501 B2 | * | 8/2004 | Distler et al. | 714/738 |
| 6,807,646 B1 | * | 10/2004 | Williams et al. | 714/736 |
| 6,829,740 B2 | * | 12/2004 | Rajski et al. | 714/729 |
| 2003/0115525 A1 | * | 6/2003 | Hill et al. | 714/726 |

(Continued)

OTHER PUBLICATIONS

Gosh, et al., "A BIST Scheme for RTL Controller-Data Paths Based on Symbolic Testability Analysis," pp. 554-559, Jun. 15-19, 1998, ISBN, San Francisco, CA, USA.

(Continued)

*Primary Examiner*—John P Trimmings
*Assistant Examiner*—Guerrier Merant
(74) *Attorney, Agent, or Firm*—Vierra Magen Marcus & DeNiro LLP

(57) ABSTRACT

A Multiple Input Shift Register (MISR) is used to generate signatures, based on data from a device under test, in order to validate the proper sequence and content of the data over a defined period of time. The MISR described herein includes the ability to "tag" the signatures for each time period using an incrementing value, and make that tag and the signature readable by a test controller. The MISR has the flexibility to be reset to a known initial state (or otherwise load a seed value) at the beginning of each time period or to continue accumulating signatures without being reset (or using the seed value). Accumulation of signatures over an extended period of time allows a test controller to validate that no errors occurred during a long term test without having to closely monitor the intermediate results.

37 Claims, 11 Drawing Sheets

U.S. PATENT DOCUMENTS

| | | | | |
|---|---|---|---|---|
| 2003/0223397 | A1* | 12/2003 | Iacono et al. | 370/342 |
| 2004/0107395 | A1* | 6/2004 | Volkerink et al. | 714/732 |
| 2004/0133832 | A1* | 7/2004 | Williams et al. | 714/726 |
| 2004/0216061 | A1* | 10/2004 | Floyd et al. | 716/4 |

OTHER PUBLICATIONS

Hosokawa, et al., "Design for Testability Strategies Using Full/Partial Scan Designs and Test Point Insertions to Reduce Test Application Times," pp. 485-491, 2001 IEEE.

Kishinevsky, et al., "Partial Scan Delay Fault Testing of Asynchronous Circuits," pp. 728-735, 1997 IEEE.

Mukherjee, "Design for Testability to Achieve High Test Coverage," IEEE Symposium on Defect and Fault Tolerance, pp. 1-9, Wipro Technologies, 2000 IEEE, Japan.

Nourani, et al., "Integrated Test of Interacting Controllers and Datapaths," ACM Transactions on Design Automation of Electronic Systems, Jul. 2001, vol. 6, No. 3, pp. 401-422.

Tsai, et al., "Improving the Test Quality for Scan-based BIST Using a General Test Application Scheme," 6 pgs., 1999 ACM, New Orleans, LA, USA.

* cited by examiner

Fig. 2
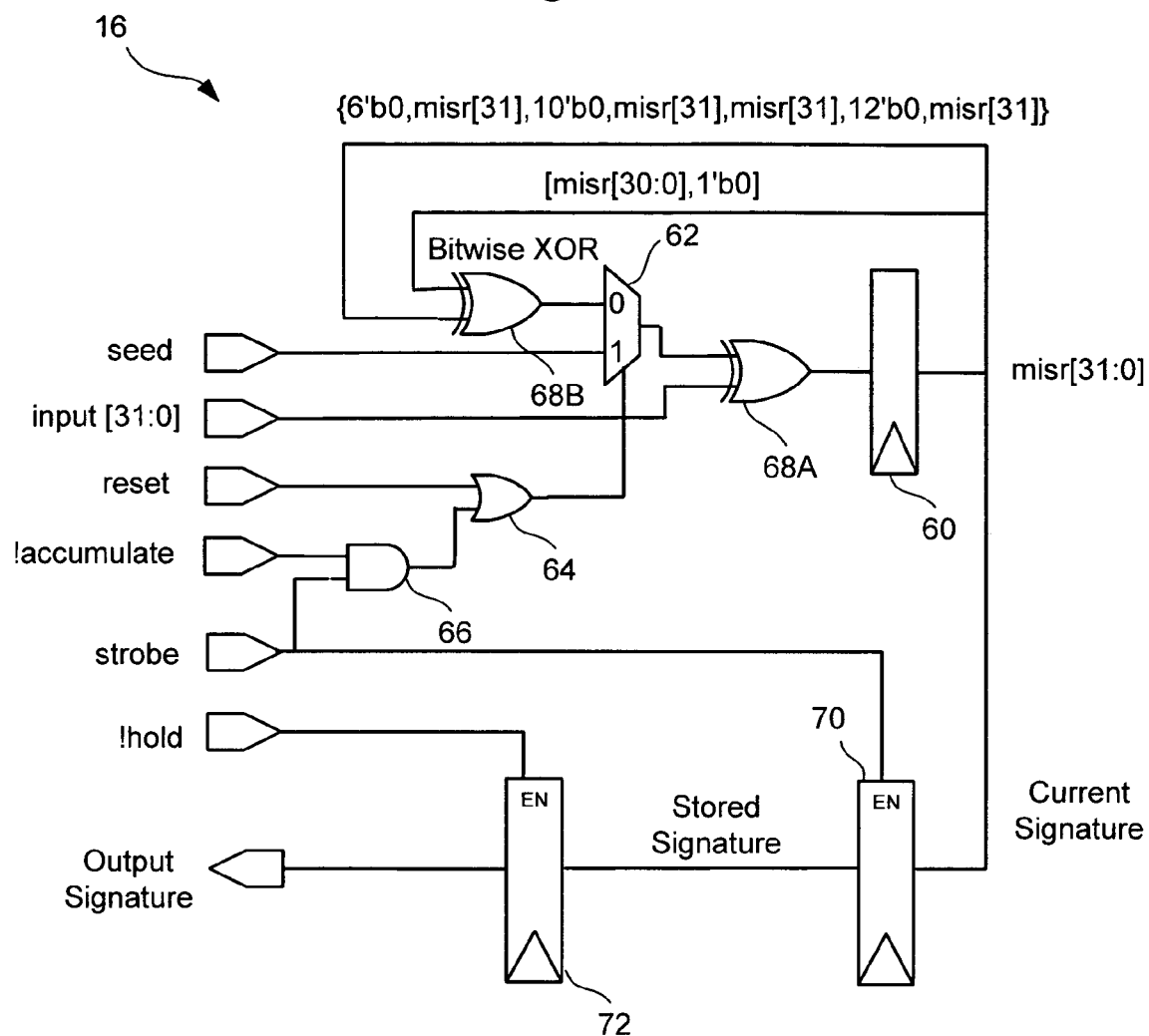
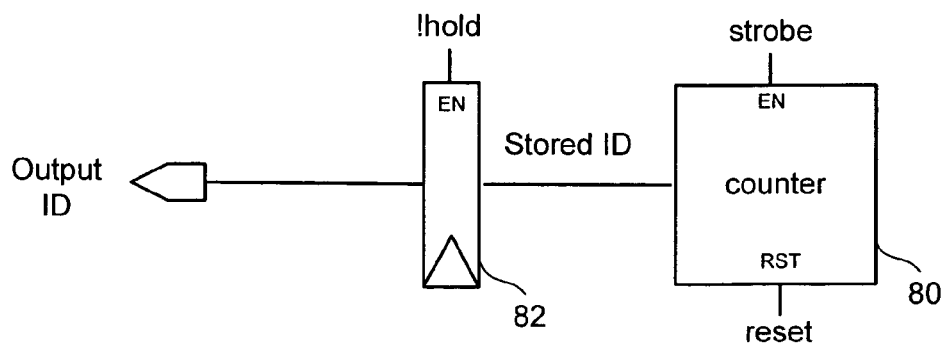

DIGITAL SIGNATURE GENERATION FOR HARDWARE FUNCTIONAL TEST

BACKGROUND OF THE INVENTION

1. Field of the Invention

The present invention relates to testing electronics.

2. Description of the Related Art

With the scaling, increase in density and mass production of integrated circuits, appropriate testing has become a more important part of the design and development process. The design process has several steps. With each step of the design process, there is a corresponding step or steps involved in testing and validating the system. Some of these testing steps are described below.

Early in the design process, an engineer will perform behavioral simulations. This process involves writing models of the components in a descriptive behavioral language (e.g., C, Verilog, VHDL, etc.), writing stimulus and monitoring the components to validate correct operation. After behavioral simulations, logic gates will be synthesized and the same (or different) tests can be performed on the gate level netlists. One advantage of testing at behavioral and gate levels is that the designer has complete visibility to components in the system. However, current tools do not correctly model meta-stability when latching an asynchronous signal with a clock. Additionally, timing is usually turned off to speed up the simulation. For example, timing may be verified through other tools. Such behavioral and gate level simulations can also be very slow, which limits the amount of tests that can be run and usually prevents real software from being used to test the design. As such, tests at the gate level simulation and behavioral simulation tend to not test real world behavior.

Subsequent to gate level simulations, a designer may perform chip emulation, which includes mapping the design to programmable logic devices that allow for faster simulation. One advantage is that more tests and longer tests can be run, the tests are run on real hardware, and asynchronous clock boundaries can be tested. Additionally, software can be used to test the system. However, the programmable logic devices do not necessarily match the final circuit implementation; therefore, the test may not be a real world test of the final product. Additionally, the designer does not have full visibility of the many components in the design.

Once a chip is fabricated it can be tested on a chip tester that has control over the pins of a chip. Test vectors are created (manually or via software) to validate the correct fabrication of the chip. On one hand, such chip testing is testing the real silicon to be used. Therefore, the testing can be very accurate. On the other hand, not all the functions of the chip can be tested and there is a limitation on how much time the tester can devote to testing a particular chip. Additionally, chip testing usually does not validate asynchronous clock boundaries. In many cases, tests are usually not running with full speed clocks.

Subsequent to chip testing, a designer may perform a system test. That is, the chip and other components are placed in the system. For example, components may be mounted on a printed circuit board. Software tests can be run on the real system. Therefore, a full test sweep is possible on the actual product. However, there is limited test time on the manufacturing tester. That limited test time is usually devoted to validating that the system was fabricated correctly and is not necessarily used to validate correct functionality for all aspects of the design. With audio and video applications, usually only analog outputs are available to the external tester. Therefore, very expensive external test apparatus are required to capture the output, digitize it and validate proper system behavior. When errors occur, fault isolation can be problematic.

After the system is built, software can be run on the system. This includes a series of tests to validate the proper functionality of the system. Usually, such software tests are run on corner lots of the silicon and system, assuming that any fabrication errors are caught by the chip and system testers. The advantage of such software tests is that they test the actual product that consumers will receive. However, there is not enough visibility to the hardware to determine where problems are occurring, and validating that the test ran correctly is usually done by a human operator which can be a source of error.

After a system is provided to a user, many systems will include power-on self tests. That is, when a consumer turns on the machine, some manner of basic error checking is performed to validate the proper operation of the system. These tests are not complete and they typically only provide a basic go/no-go status which is used to either continue the boot process or halt with an error message of some sort (e.g., "please contact #").

To increase the reliability of electronic devices, a testing scheme is needed that satisfies the concerns described above. Additionally, it is desired to have a testing scheme that provides for long running tests without requiring close monitoring of a large amount of intermediate results. Having to monitor an unreasonably large amount of intermediate results uses CPU cycles, requires resources to store the results, and requires resources to monitor and review the results.

SUMMARY OF THE INVENTION

A system is described herein for generating signatures that can be used, among other things, to test electronics.

One embodiment includes a Multiple Input Shift Register (MISR) that generates signatures, based on data from a device under test, in order to validate the proper sequence and content of the data over a defined period of time. The MISR described herein includes the ability to "tag" the signatures for each time period using an incrementing value, and make that tag and the signature readable by a test controller. The MISR has the flexibility to be reset to a known initial state (or otherwise load a seed value) at the beginning of each time period or to continue accumulating signatures without being reset (or using the seed value). Accumulation of signatures over an extended period of time allows a test controller to validate that no errors occurred during a long term test without having to closely monitor the intermediate results.

One embodiment of a suitable MISR includes a linear feedback shift register receiving input data, a first storage element in communication with the feedback shift register, and an identification generation circuit. The first storage element stores the current state of the shift register in response to a strobe signal. The identification generation circuit outputs a new identification value in response to the strobe signal.

One example of an implementation includes receiving data values, accumulating the data values using the shift register with feedback to create running signatures, providing a subset of the signatures to an output, and providing identifications for the signatures in the subset.

These and other objects and advantages of the present invention will appear more clearly from the following description in which the preferred embodiment of the invention has been set forth in conjunction with the drawings.

BRIEF DESCRIPTION OF THE DRAWINGS

FIG. 2 depicts the components of a MISR.

DETAILED DESCRIPTION

Figure 1A:
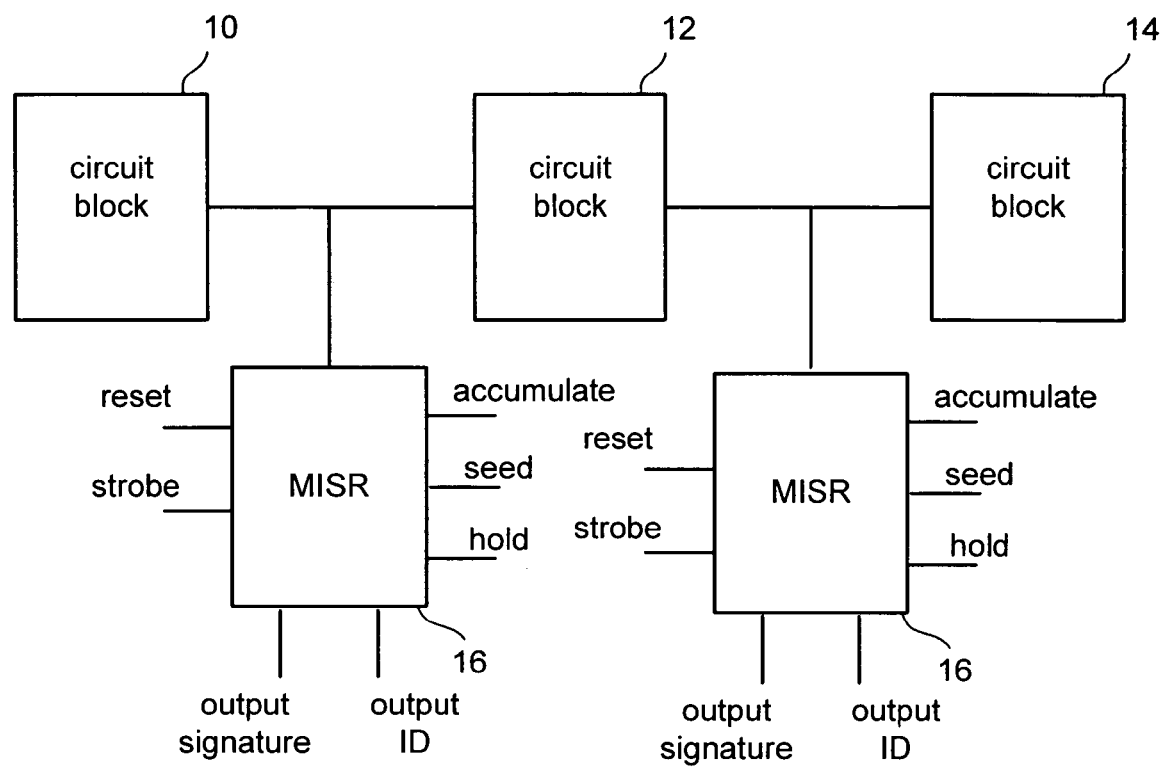
FIG. 1A is a block diagram depicting a system using individual MISR's for generating signatures.

There are numerous means for testing systems that include hardware and/or software components. One embodiment described herein makes use of a MISR in order to validate the proper sequence of data over a period of time. One embodiment of a MISR is based on a Linear Feedback Shift Register (LFSR). A LFSR is a sequential shift register with combinational logic that causes it to pseudo-randomly cycle through a sequence of binary values. Feedback from an output of an LFSR's shift register is provided to a selection of points (called taps) in the register chain and constitutes performing an exclusive OR operation to provide these taps back into the register. Register bits that do not need an input tap operate as a standard shift register. It is this feedback that causes the register to loop through repetitive sequences of pseudo-random values. The choice of taps in an LFSR determines how many values there are in a given sequence before the sequence repeats. An optimally chosen set of taps will have a sequence of $2^n-1$ values where n is the number of bits in the register. The only value missing out of the $2^n$ possible register values is 0.

A MISR is similar to a LFSR except that a parallel input is combined with the shifted data and the feedback using exclusive OR gates. The choice of taps is usually expressed as a polynomial. Typically, a primitive polynomial is used. One example of a suitable primitive polynomial is $X^{32}+X^{25}+X^{14}+X^{13}+1$. A MISR implementing this polynomial would include taps at the $0^{th}$, $13^{th}$, $14^{th}$ and $25^{th}$ bit. The present invention, however, is not restricted to any particular polynomial and various other polynomials (and register bit widths) can be used.

In one embodiment of the present invention, the MISR is used to create a running stream of signatures. Each signature is based on operating on a unit of input data. The input data is grouped into blocks of data. At the end of each block of data, the signature is stored and provided at an output of the MISR. For example, if a block of data has 500 samples, then 500 signatures will be calculated sequentially; however, only the last signature of the block will be stored. Typically, there will be many blocks of data used in a test; therefore, many signatures will be stored.

In order to validate the proper sequence of signatures over a long term test, the MISR described herein has ability to tag (identify) each stored signature. For example, a counter can be used to count each stored signature and that count is provided at the output of the MISR as an identification (ID) for the corresponding signature. The stored signatures and IDs can be accessed by a test controller or any other entity for storage and comparison to signatures from other tests. The MISR also has the flexibility to be reset after each block, after a certain number of blocks, and/or at the beginning of the test. At reset, the MISR is reset to a known value (called a seed), which can be all zeros or a predefined value (hardwired or programmable). If the input data may begin with zeroes, it would be better to make sure that the seed is not all zeros since a MISR would be unable to correctly differentiate between different numbers of input leading zeroes if the seed was zero. Accumulating signatures (e.g., not resetting) over an extended period of time allows for validating that no errors occurred during a long-term test without having to closely monitor every single signature generated.

A MISR can be used in many different designs. For example, FIG. 1A is a block diagram depicting one example of a MISR in a generic electronic system. FIG. 1A shows three circuit blocks 10, 12 and 14. Circuit block 10 is connected to circuit block 12 by a bus. Circuit block 12 is connected to the circuit block 14 by a different bus. These circuit blocks can be any of various functions used in many different types of systems. In one embodiment, an MISR is inserted between circuit blocks in order to test the inputs and outputs of the various circuit blocks. For example, FIG. 1A shows an input of a first MISR 16 connected to the bus between circuit block 10 to circuit block 12. FIG. 1A also shows a second MISR 16 connected to the bus between circuit block 12 and circuit block 14. Each data sample provided to circuit block 12 as an input from circuit block 10 will be used by a MISR to create a signature. Similarly, each data sample provided to circuit block 14 as an input from circuit block 12 will be used by a MISR to create a signature. At the end of every block of data, the current signature will be stored and that stored signature will be provided at the output of the MISR 16 on the output signal labeled "output signature." Each output signature will be provided with an output ID on the output signal labeled "output ID." The output ID identifies the output signature. In one embodiment, the output ID is unique to each signature. For example, in one implementation, the ID can be implemented using a counter which counts up from zero to a maximum number. Thus, each output signature will receive a number based on its order in the set of output signatures. Other designs for providing an ID can also be used.

The MISR will know that a block of data has completed when it receives an indication on the strobe signal input. The strobe signal (consisting, in one embodiment of a single clock cycle wide pulse) is generated after an interval consisting of a deterministic number of samples. Due to the nature of the MISR, an extra sample or a dropped sample will result in different signature values being generated from thereon (which is the intended functionality). The reset input is used to reset the MISR using the value at the seed input. In one embodiment, the seed value is all zeros. In another embodiment, the seed value can be a value other than all zeros (e.g., 0xDEADBEEF). The seed value can be hardwired or programmable from the test controller (or another device). In one embodiment, reset is asserted whenever the device is under a reset condition, if the device has not been enabled, or if the device has been enabled but real data has not be received yet.

MISR 16 also includes an input signal called accumulate. When accumulate is asserted, the MISR will not be reset upon storing a signature. That is, MISR will continue to accumulate signatures without loading the seed value back into the shift register. If accumulate is not asserted, then each time a signature is stored, the seed value will used, effectively resetting the MISR. The hold signal is used to hold the output signature and output ID at the output of the MISR. If the hold signal is asserted, then output signature and ID will be held, even though the internal signature and ID (discussed below) are updated when the strobe signal is asserted. For example, if the test controller trying to read the output ID or output signature cannot read those values fast enough (i.e. before the next block's data is stored on top of them), the test controller may assert the hold signal which will prevent the output signature and output ID from being updated. Even if a strobe signal arrives while the hold signal is asserted, the output signature and ID will not be updated. The MISR will continue to create new signatures (and new IDs if a strobe is received); however, the new signatures and IDs will not be presented at the output. When the hold signal is deasserted, the last internal signature and ID will be presented at the output. If there are no errors during the test, the signatures stored after the hold signal is deasserted will match expected values; thereby, validating the device being tested even though some of the signatures were not stored.

The values for reset, strobe, accumulate, seed and hold can be provided to the MISR from the various circuit blocks, from a test controller circuit on the same chip as the MISR or from test controller that is not on the same chip as the MISR. It is a requirement, in one embodiment, that the reset and strobe signals be provided in a manner that is consistent with a deterministic number of input samples. For instance, the number of input samples between one strobe and the next or between the deassertion of reset and the first strobe needs to be the same from one test run to the next otherwise the resulting signature values that are produced will not match correctly. In one embodiment, an integrated circuit can use a SMBus or an $I^2C$ bus (both of which are known in the art) to communicate the static signals (seed, accumulate, hold) from a test controller. The output signature and ID can be stored in a register that can be accessed by a test controller. The output signature and ID can also be made available to a test controller (on or off chip) or other circuit via a SMBus or an $I^2C$ bus. Alternatively, an integrated circuit can include built-in self-test logic for controlling the MISR input signals and receiving the output signatures and output IDs. In one embodiment, a test controller stores the output signatures and IDs in a data structure. At the end of the test, all or a subset of the output signatures and IDs are compared against expected values to see if the test passed.

Figure 1B:
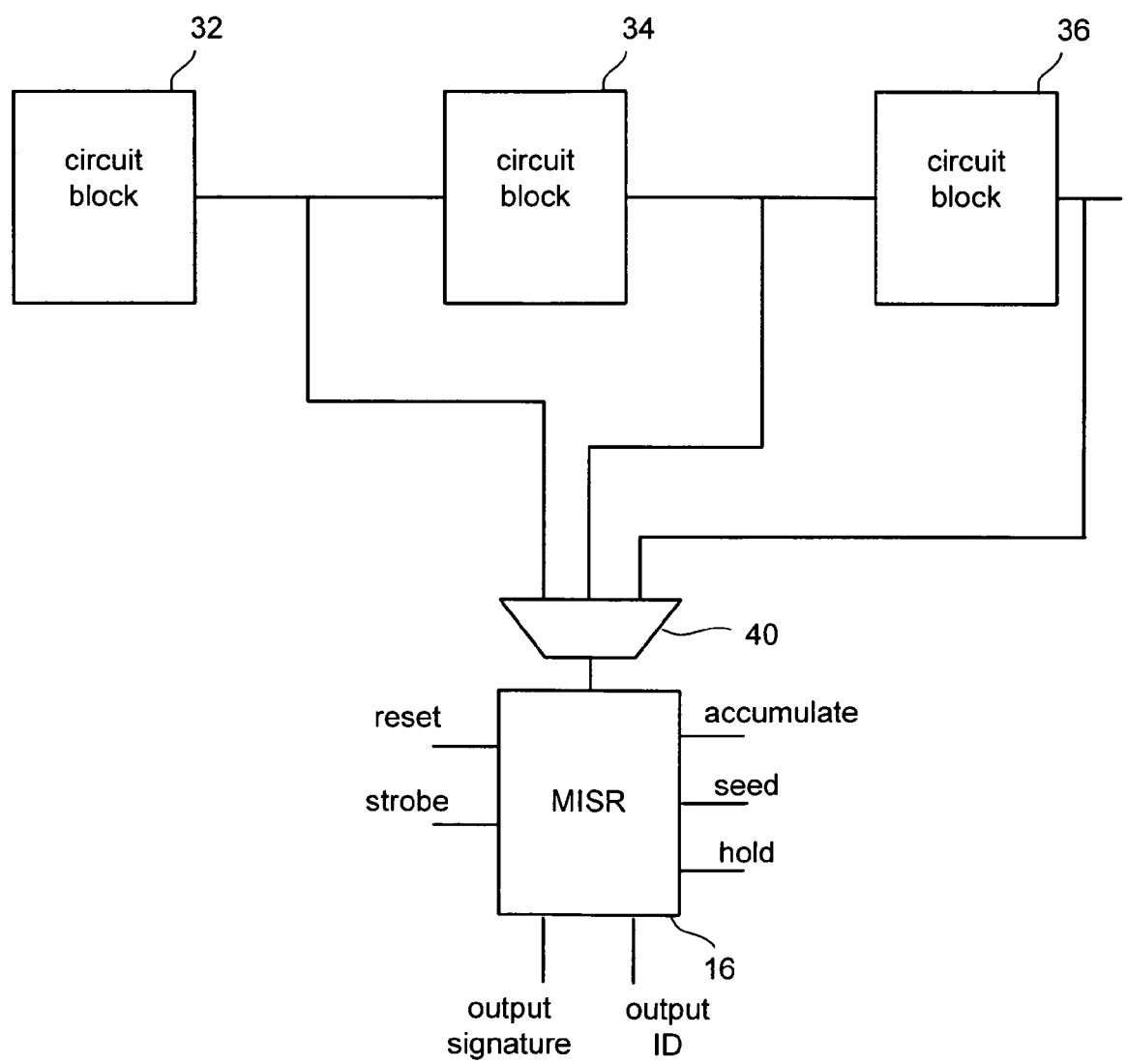
FIG. 1B is a block diagram depicting another embodiment of a system using a single MISR for the same purpose.

FIG. 1B is a block diagram depicting another embodiment of a system that can use MISR 16. In this embodiment, instead of having a MISR for each function to be tested, one MISR can test multiple functions. Each function has its data sent to a multiplexer. A test controller circuit will use the select line for the multiplexer to choose which function to use as input data. For example, FIG. 1B depicts the outputs of circuit block 32, circuit block 34 and circuit block 36 connected to multiplexer 40. The output of multiplexer 40 is connected to MISR 16.

FIG. 2 is a block diagram describing more details of MISR 16. FIG. 2 shows a register 60. In one embodiment, the register holds the current signature and is 32 bits wide. In other embodiments, the register can have less than 32 bits or more than 32 bits. Note that if register 60 is made wider than 32 bits, then more pseudo random numbers can be generated (assuming that a larger primitive polynomial is selected). In one embodiment, register 60 is made up of flip-flops. In other embodiments, register 60 can be made up of other components or register 60 can be replaced by another storage component. The output of register 60 is labeled as misr[31:0].

The input to register 60 comes from bitwise exclusive OR block 68A, which receives two inputs. A first input to bitwise exclusive OR block 68A is the input data Input[31:0] and the second input to bitwise exclusive OR block 68A is the output of multiplexer 62. Multiplexer 62 receives two inputs. A first input to multiplexer 62 is the seed value. The seed value can be provided by the test controller. The second input to multiplexer 62 is the output of Bitwise Exclusive OR block 68B. The selection pin for multiplexer 62 is from the output of OR gate 64. OR gate 64 has two inputs. The first input to OR gate 64 is the reset signal. The second input to OR gate 64 is the output of AND gate 66. The inputs to AND gate 66 include the strobe signal and the inverse of the accumulate signal. Thus, if reset is asserted, multiplexer 62 will cause register 60 to load the result of an exclusive OR operation on the seed value and input[31:0]. In some embodiments, the input data can be less than 32 bits. That is, it is possible that the input data has fewer bits than register 60. In that case, input[31:0] is assigned to the input data with the unused bits in input[31:0] assigned to 0. If accumulate is not asserted and there is a strobe asserted, then register 60 will be loaded with the result of an exclusive OR operation on the seed value and input[31:0]. When these two conditions do not occur, register 60 is loaded with the result of an exclusive OR operation on Input[31:0] and the output of Bitwise Exclusive OR block 68B.

Bitwise Exclusive OR block 68B includes performing an exclusive OR operation on two inputs. A first input to the Bitwise Exclusive OR block 68B is the selective feedback to the taps of register 60. As discussed above, the example depicted in the FIG. 2 implements the polynomial $X^{32}+X^{25}+X^{14}+X^{13}+1$. Thus, misr[31] is fed back to taps at bits 0, 13, 14 and 25. The second input to bitwise exclusive OR block 68B is a shifted version of register 60 (misr[30:0], 1'b0). These two inputs and input[31:0] (or a subset of the three) are accumulated over time to create the signatures.

The output of register 60 is provided to the data input of register 70. The load enable input for register 70 is connected to the strobe signal. Thus, when strobe is asserted, register 70 will be updated with the contents of misr[31:0] at the next clock. If strobe is not asserted, register 70 will remain unchanged. The output of register 70 is the stored signature value and is provided to the data input of register 72. The output of register 72 is the output signature. The load enable input for register 72 is the inverted hold signal. Thus, when the hold signal is not asserted, the output of register 70 will be loaded into register 72 on the next clock cycle. If the hold signal is asserted, then register 72 will not update. In one embodiment, registers 70 and 72 are made of flip flops and are 32 bits wide. In another embodiment, register 72 is made up of latches and the hold signal is connected to the latch enable.

MISR 16 also includes an identification generation circuit for creating the IDs associated with each output signature. In one embodiment, the identification generation circuit includes counter 80. The reset input to counter 80 is connected to the reset input of MISR 16 so that counter 80 is set back to zero when reset is asserted. The enabled input to counter 80 is connected to the strobe signal. Thus, counter 80 will only increment during clock cycles that strobe is asserted. The output of counter 80 is stored in register 82, which in one embodiment is made of flip flops (or other storage devices). The inverted hold signal is connected to the load enable input for register 82. When hold is not asserted, the output of counter 80 is tracked by register 82. If hold is asserted, register 82 holds its data values regardless of counter 80. In the depicted implementation, the first stored signature will have an ID set to '1'. This allows an external controller without visibility into the strobe signaling to note when the first signature has been stored. Note that for ease of illustration, clocks signals are not depicted in FIG. 2. However, one skilled in the art would understand that registers 60, 70, 72, and 82, and counter 80 receive a clock signal. In one embodiment, registers 72 and 82 are made up of latches.

Figure 3:
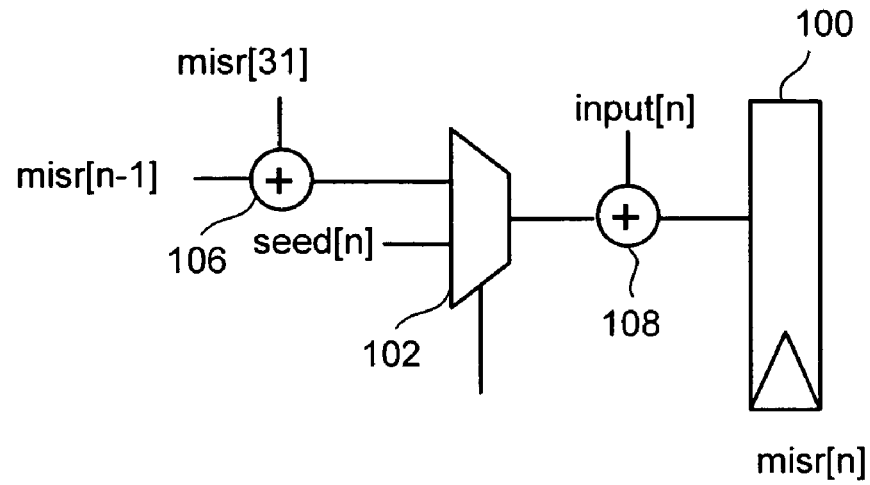
FIG. 3 depicts one bit of a MISR that receives feedback (assumes 32-bit MISR) and an input bit.

FIG. 2 depicts a single multiplexer block 62 and Bitwise Exclusive OR blocks 68A and 68B. In one embodiment, register 60 includes 32 flip-flops. Each flip-flop will have its own associated multiplexer and its own set of zero, one or more exclusive OR gates. Some of the flip-flops will receive feedback from misr[31] and some will not receive such feedback. FIG. 3 is a schematic drawing of one bit that receives feedback. Flip-flop 100 stores the data for misr[n]. The input to flip-flop 100 is provided from exclusive OR gate 108. Exclusive OR gate 108 receives two inputs: the nth bit of the input data input [n] and the output of multiplexer 102. One input to multiplexer 102 is the associated seed bit seed [n]. The other input to multiplexer 102 is from the output of exclusive OR gate 106. Exclusive OR gate 106 receives misr [31] and the previous bit in the register 60, which is misr[n−1]. The select line for multiplexer 102 is from the output of OR gate 64 (see FIG. 2).

Figure 4:
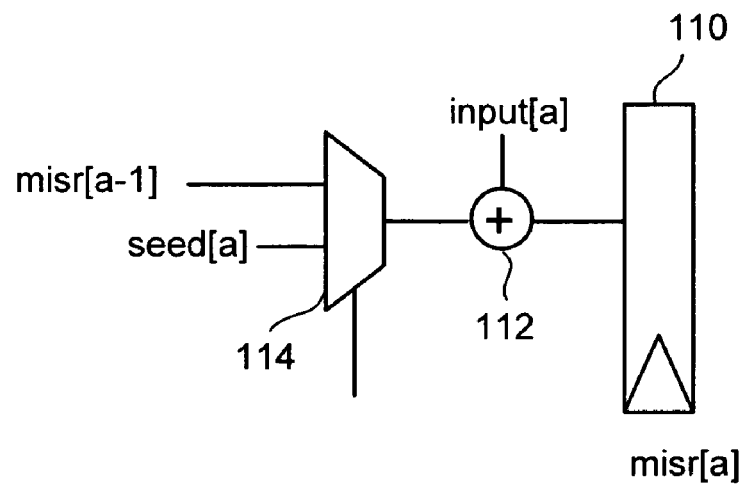
FIG. 4 depicts one bit of a MISR that does not receive feedback, but receives an input bit.

FIG. 4 provides a schematic drawing of a bit misr[a] in register 60 that does not receive feedback from misr[31]. FIG. 4 depicts flip-flop 110 receiving input from the output of exclusive OR gate 112. Exclusive OR gate 112 receives two inputs. A first input to exclusive OR gate 112 is the appropriate input bit input[a] and the other input to exclusive OR gate 112 is the output of multiplexer 114. The selection line for multiplexer 112 is from OR gate 64 (see FIG. 2). The inputs to multiplexer 114 include the previous bit in register 60, which is misr[a−1], and the seed bit seed[a].

Figure 5:
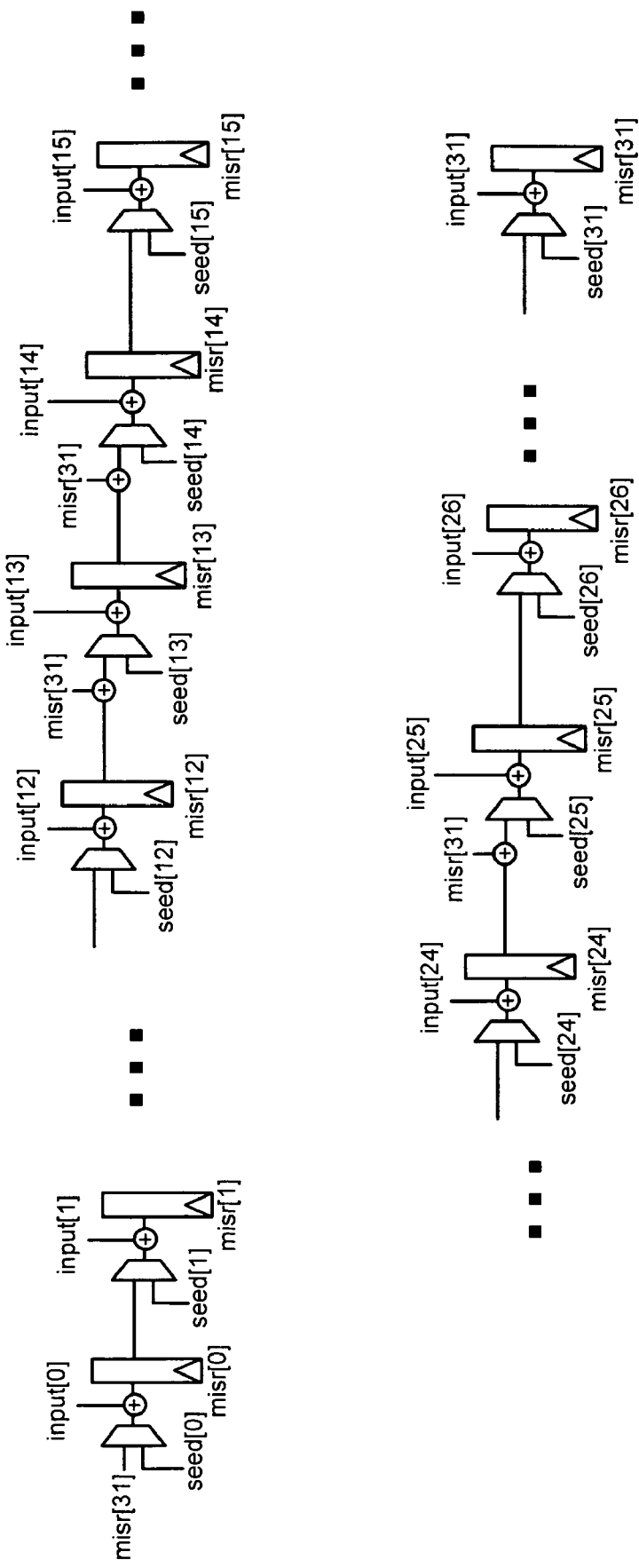
FIG. 5 is a schematic diagram depicting a portion of a MISR.

FIG. 5 is a schematic of a portion of one implementation of register 60, multiplexer 62 and exclusive OR blocks 68A and 68B. The bits depicted in FIG. 5 utilize the components of either FIG. 3 or FIG. 4, as appropriate. Bit 0, bit 13, bit 14 and bit 25 receive feedback taps; therefore, they utilize the components of FIG. 3. As can be seen, misr[0] receives the output of an exclusive OR gate that operates on input[0] and the output of a multiplexer. That multiplexer chooses between seed[0] and misr[31]. The bit misr[13] receives the output of an exclusive OR gate that operates on input[13] and the output of a multiplexer. That multiplexer chooses between seed[13] and an exclusive OR gate that operates on misr[31] and misr [12]. The bit misr[14] receives the output of an exclusive OR gate that operates on input[14] and the output of a multiplexer. That multiplexer chooses between seed[14] and an exclusive OR gate that operates on misr[31] and misr[13]. The bit misr[25] receives the output of an exclusive OR gate that operates on input[25] and the output of a multiplexer. That multiplexer chooses between seed[25] and an exclusive OR gate that operates on misr[31] and misr[24]. The remaining bits will receive output of an exclusive OR gate that operates on the associated input and the output of a multiplexer that chooses between the associated seed bit and the previous bit. To make the drawing more readable, misr[2]–misr[11], misr [16]–misr[23], and misr[27]–misr[30] are not depicted in FIG. 5 (e.g., they are depicted by " . . . "); however, each of those bits are implemented in the form depicted by the schematic of FIG. 4.

In some embodiments, the width of the input data is less than the width of register 60. In that case, those bits that do not receive input data can have a 0 substituted for each unused bit. That allows one to remove the associated exclusive OR gate for that bit (since 0 XOR A=A).

Figure 6:
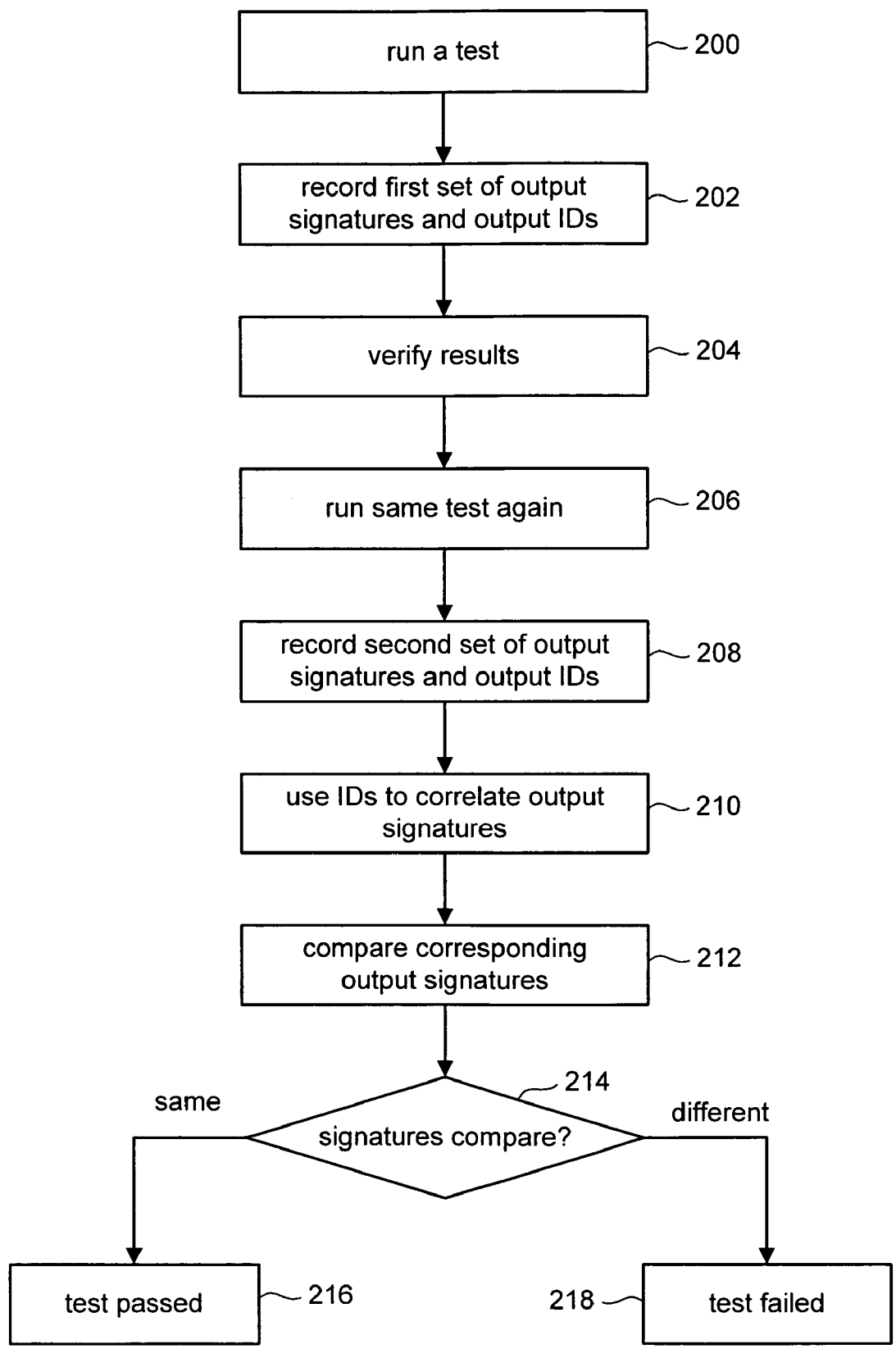
FIG. 6 is a flow chart describing one embodiment of a process for testing using signatures.

FIG. 6 is a flow chart describing one embodiment of a process for testing a design using signatures and the MISR described above. In step 200, a test is run on the design. In one embodiment, the test is run on a behavioral model. In another embodiment the test is run on a gate level simulation. In other embodiments, the test can be run on actual hardware. The design being tested will include the MISR described above. The test can be created by an engineer, software or hardware. In one embodiment, a test circuit internal to the chip or external to the chip can be used to provide the test.

During the test, a set of output signatures and IDs will be recorded (e.g., in response to the strobe signal) in step 202. For example, a simulation system can record all the values of the output signatures and output IDs into a data structure (e.g., on a hard disc, floppy disk, flash memory, DVD, RAM, etc.). With a hardware tester, a host system can read the output signature and output ID, and record the data in memory, disk drive, flash memory, etc. In step 204, the results for the test are verified. That is, in one embodiment, a human designer will manually verify that the signatures are all correct. In another embodiment, software can be used to automatically verify that the signatures are correct. In yet another embodiment, step 204 will not be performed. That is, if the designer knows that the particular version of the design or hardware is correct, then the test can be used to create a golden set of results. The golden set of results will be compared against future revisions of the design or hardware to test compatibility or the effect of various operating conditions.

In step 206, the same test is run again. The second test can be run on different hardware, a different version of the design, or the same or different version of the design under different operation conditions (e.g., varied temperature, voltage, manufacturing process, or other environmental factors). In one scenario, the first test run of step 200 is a behavioral or gate level simulation and the second test run of step 206 is performed on the physical chip after, or as part of, the manufacturing process. As part of the test, the output signatures and IDs of the second test run are recorded in step 208. In step 210, the IDs for the signatures from the first test run and second test run will be used to correlate the various signatures. That is, for example, a signature with ID 25 from the first test run is paired with the signature with ID 25 from the second test run. In step 212, the corresponding signatures (e.g., signatures with the same IDs) will be compared. If all corresponding signatures match (step 214), then the test passed (step 216). If one or more of the signatures do not match, then the test has failed (step 218).

Figure 7:
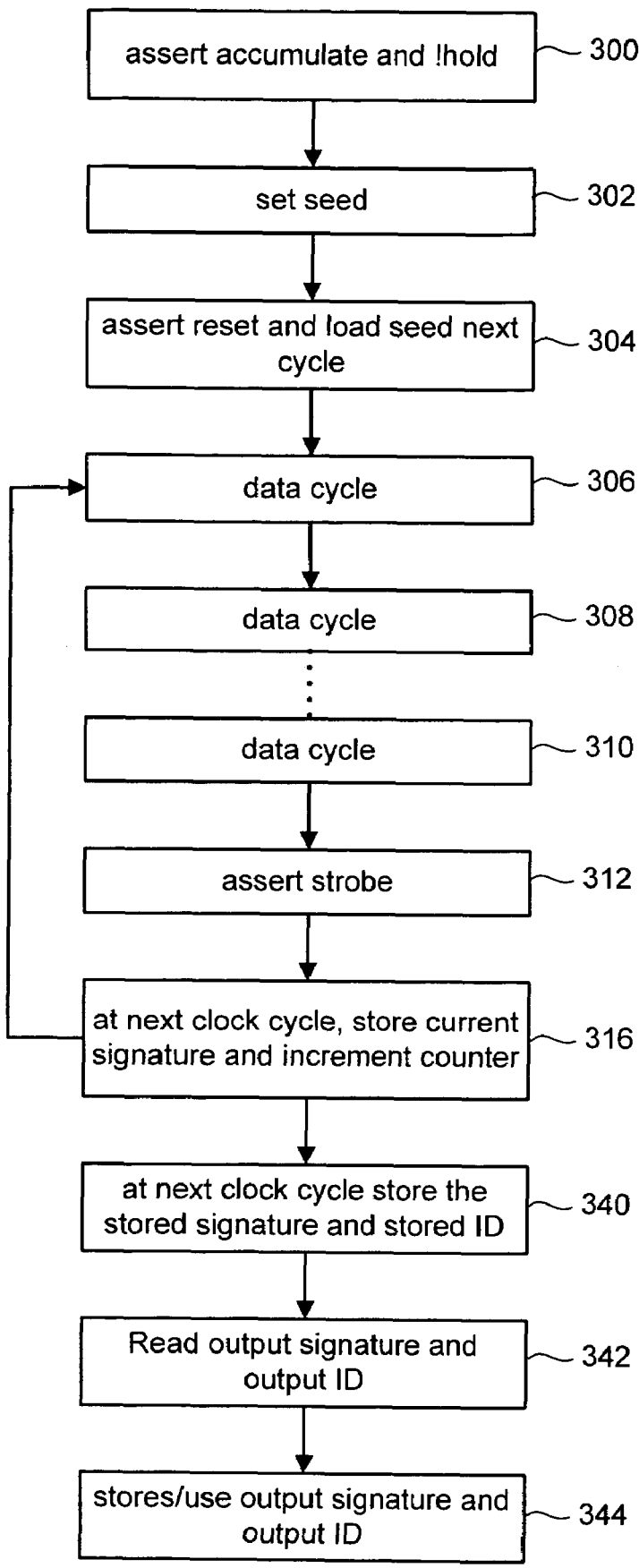
FIG. 7 is a flow chart describing one embodiment of a process for generating signatures.

FIG. 7 is a flow chart describing one embodiment of a process for generating and storing signatures. In step 300, the test controller (or other entity) will assert the accumulate signal and not assert the hold signal. In one embodiment, step 300 is performed before the test is run. Alternatively, step 300 can be performed and repeated at various points during the test. In step 302, the seed value is set. As discussed above, some embodiments contemplate a programmable seed where the test controller can determine the seed and provide that programmable seed to the MISR. In other embodiments, the seed can be hardwired. At step 304, the reset signal is asserted. This causes the seed to be used (see multiplexer 62 of FIG. 2) in the next cycle. In one embodiment, reset is asserted at power-up. In other embodiments, reset can be asserted until real data is being generated for the first time. In one implementation, the seed is loaded by performing an exclusive OR operation on the seed and the input data (see FIG. 2). If it is desired that the exact value of the seed should be stored in the MISR, the input data can be set to all zeros so that the result of the excusive OR operation is the seed value, which can then be stored in register 60 (see FIG. 2).

Step 306, 308 and 310 depict data cycles. As discussed above, each block of data will include many sets of data. Each set of data is evaluated in a data cycle. Between step 308 and 310 is a dotted line to indicate that there could be many data cycles between steps 308 and 310. The number of data cycles performed between steps 308 and 310 is based on how much data is in a block of data. At each data cycle (step 306, 308, . . . 310), the MISR will update to a new current signature. Thus, the MISR is creating a running set of signatures. At the end of a block, the strobe signal will be asserted in step 312. The strobe signal (consisting of a pulse) is generated after an interval consisting of a deterministic number of samples. Due to the nature of the MISR, an extra sample or a dropped sample will result in different signature values being generated from thereon (which is the intended functionality). In the clock cycle after asserting the strobe signal, the signature currently in the MISR will be stored in register 70 (step 316). In addition, the counter is incremented in step 316. After step 316, the method loops back to step 306 and additional data cycles are performed for the next block of data Additionally, in the next clock cycle after step 316, the stored signature (e.g. stored in register 70) and the stored ID (output of counter 80) are stored in registers 72 and 82 (step 340).

After loading the stored signature and stored ID into registers 72 and 82 in step 340, the test controller (or other entity) can read the output signature (from register 72) and output ID (from register 82) in step 342. In step 344, the test controller will store and/or otherwise use the output signature and output ID.

There are many ways for a test controller to access the output signature and ID. In one embodiment, the design can include a SMBus, which is a system management bus defined by Intel Corporation. The SMBus is typically used in personal computers and servers for system management communications. The SMBus is a two wire interface in which various system components can communicate with each other and with the rest of the system, and is based on the principle operations of $I^2C$. $I^2C$ is a bidirectional control interface that consists of a clock and data line. The SMBus provides a control bus for system and power management related tasks. A system may use the SMBus to pass messages to and from devices instead of using individual control lines. Removing the individual control lines reduces pin count. Thus, a host off-chip can use the SMBus to access the stored signature and ID. In one embodiment, the stored signature and ID will be stored in a register on the chip. The test controller will access the register via the SMBus (or another mechanism) and record the ID and signature in a data structure associated with the host. In another embodiment, a test controller can be located on chip. That test controller can access the output signature and ID and record them in any suitable storage device.

Figure 8:
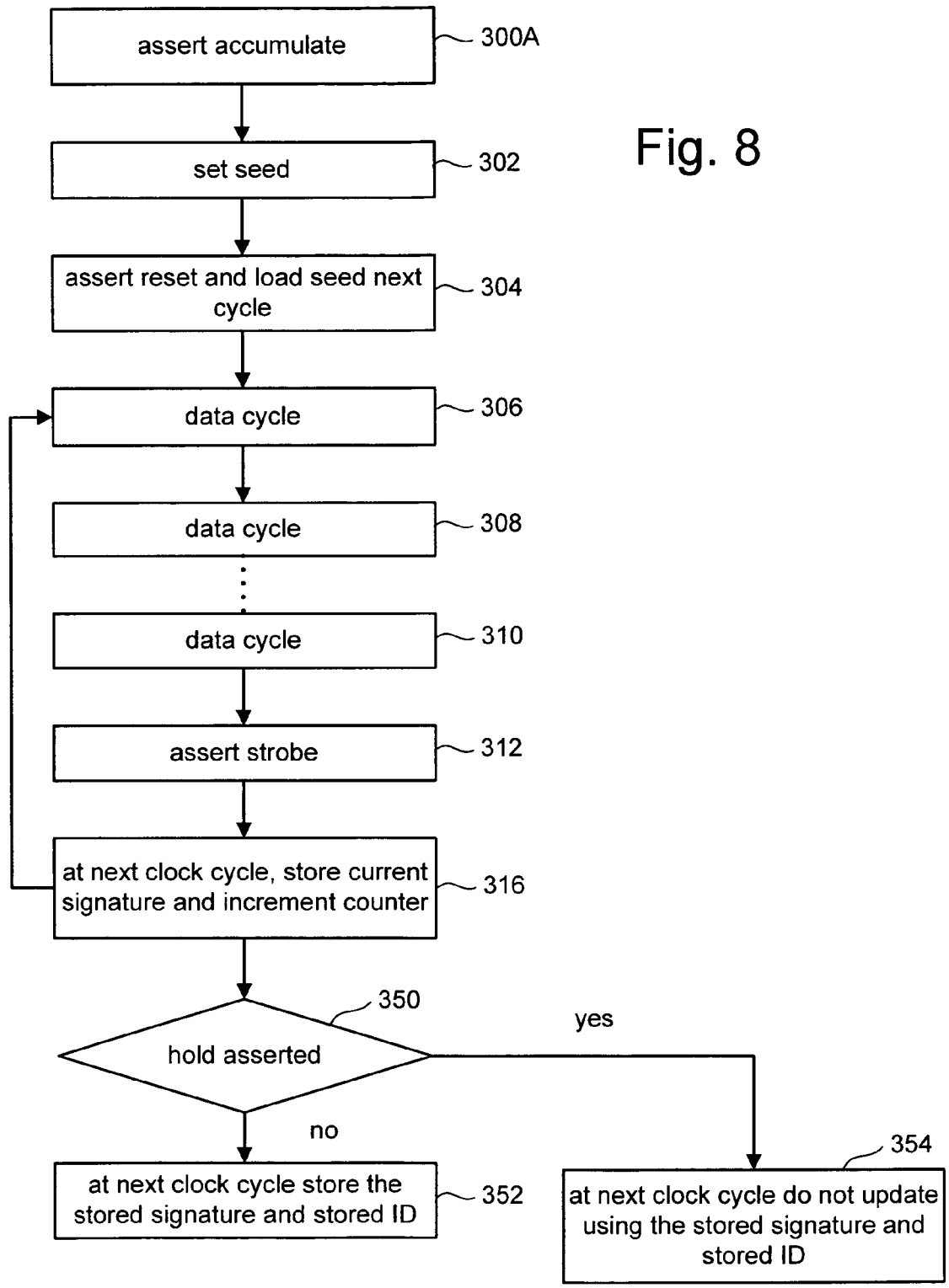
FIG. 8 is a flow chart describing one embodiment of a process for generating signatures.

FIG. 8 is a flow chart describing another embodiment of a process for generating signatures. In step 300A, the test controller (or other entity) asserts the accumulate signal. Steps 302-316 of FIG. 8 are the same as steps 302-316 of FIG. 7. In step 308, after the strobe signal is asserted, the test controller may or may not assert the hold signal. Asserting the hold signal will prevent the MISR from updating the output signature. Missing an output signature will not prevent the test controller from determining whether the test succeeded because as signatures accumulate an error will cause all subsequent signatures to be in error.

After the current signature is stored in step 316 the process loops back to step 306 and the MISR will determine whether the hold signal is asserted in step 359. If the hold signal is not asserted, then in the next clock cycle the stored signature (e.g. stored in register 70) and the stored ID (output of counter 80) are stored in registers 72 and 82 in step 352 (similar to step 340). If the hold signal is asserted, then the stored signature (e.g. stored in register 70) and the stored ID (output of counter 80) are not stored in registers 72 and 82 (step 354) This way, signatures and IDs will continue to be generated; however, they will not be updated at the output. After steps 352 and 354 of FIG. 8, the process continues by having the test controller (or other device) read (or continue reading) the output signature and output ID (as in step 342 and 344 of FIG. 7).

Figure 9:
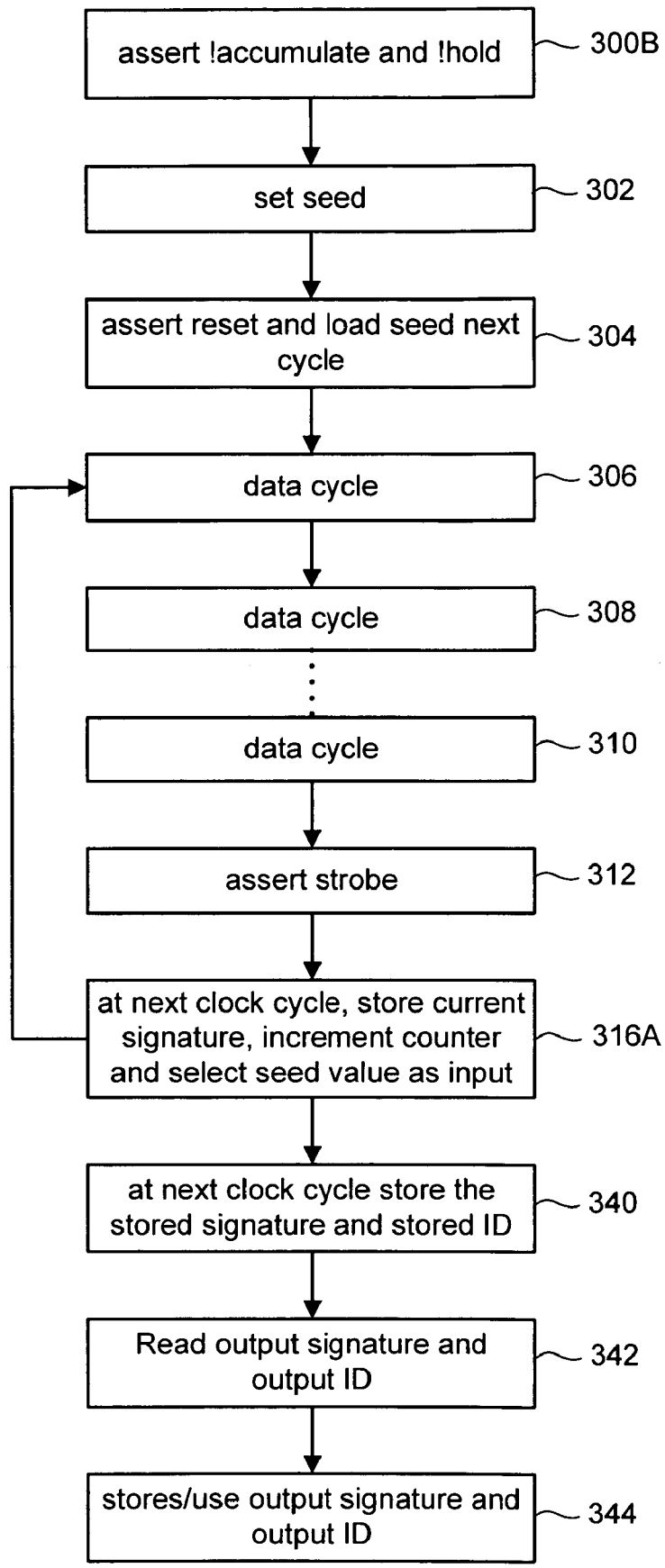
FIG. 9 is a flow chart describing one embodiment of a process for generating signatures.

FIG. 9 is a flow chart describing another embodiment of a process for generating signatures. The process of FIG. 9 includes the example where signatures are not accumulated. In step 300B, the test controller will cause the hold signal and the accumulate signal to be unasserted. Steps 302-312 are the same as in FIG. 7. After asserting the strobe signal in step 312, In the clock cycle after asserting the strobe signal, the signature currently in the MISR will be stored in register 70 and the counter is incremented in step 316A. Additionally, multiplexer 62 selects the seed value to be used with the input[31:0] for loading register 60. Steps 340-344 are the same as in FIG. 7.

The above described methods can be used with a MISR to test during the various test stages mention above. For example, the signature values generated during a behavioral simulation can be compared with a gate simulation to help validate proper synthesis and to help with test suite regressions. The signature values generated by a behavioral model can also be carried forward when running identical tests in the other environments as well. During chip emulation, either expected signatures can be generated with behavioral models and compared with the emulation results (during the emulation process) and/or the results of two identical emulation runs can be compared (and the signatures should be identical). An internal test generator can be enabled to provide stimulus for a test. When using a chip tester, a built-in test generator can greatly simplify initializing and running a functional test. Bit accurate comparisons can be made of the digital to analog converter inputs without necessarily routing those inputs to external pins (which allows the chip to have fewer pins and/or reduce special test modes). During a system test, a MISR in conjunction with built-in test pattern generators in each chip and/or block, allows for chip interconnects to be validated and provides some degree of fault isolation. With software test, the test pattern generators are typically not used. Rather, the test material originates/resides/is constructed in the system. This allows the full functional path to be validated. Furthermore, by running identical tests on parallel systems, extremely long tests can be run and only the final results checked against each other to validate that no transitory errors occurred. During a start-up test using a test pattern generator (or other source of stimulus) and the MISR, validation of the blocks and/or chips can be performed (in parallel if designed appropriately).

Figure 10:
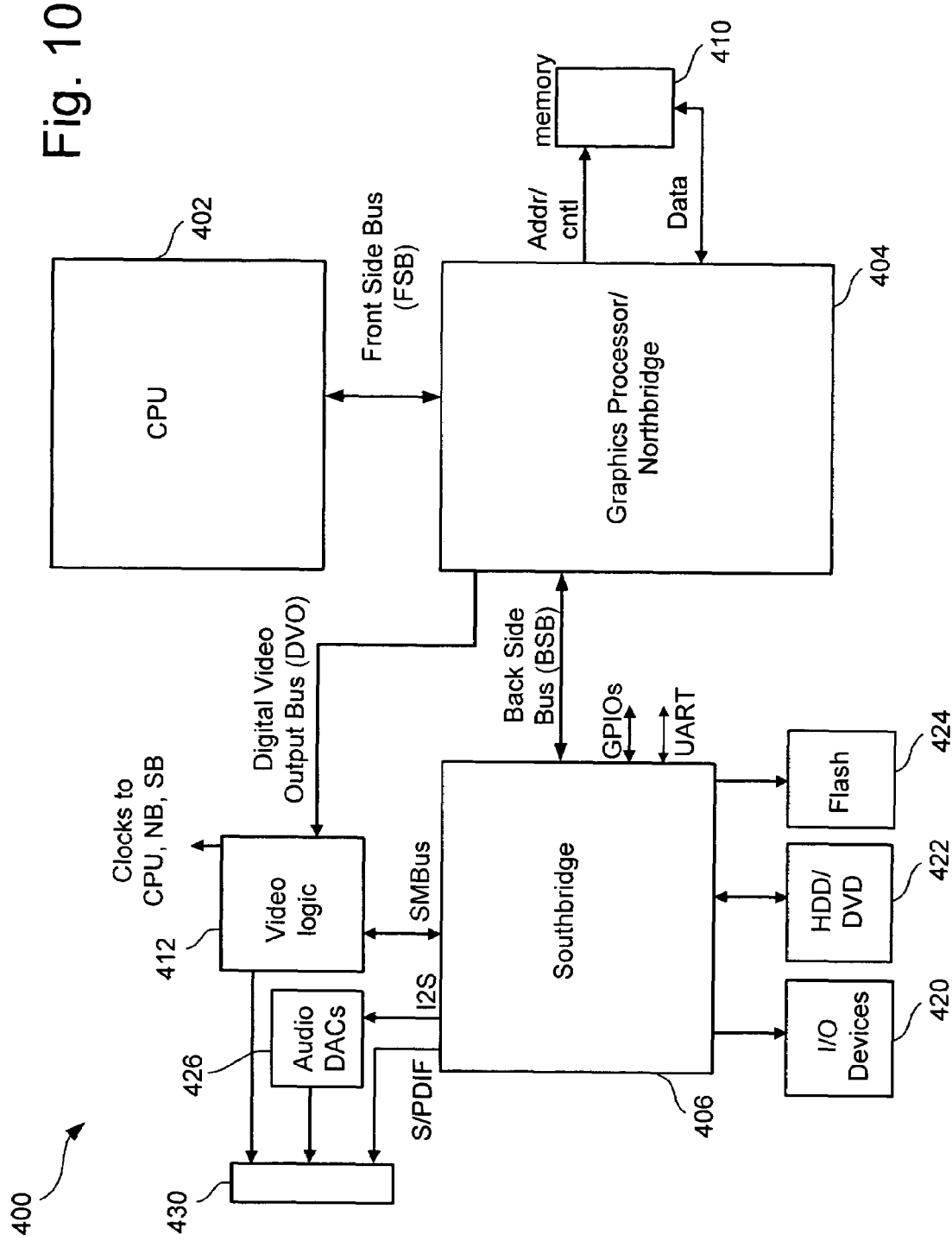
FIG. 10 is a block diagram of one example of a system that can use the MISR described herein.

FIG. 10 provides one example of a specific system that can utilize the MISR described above. System 400 of FIG. 10 can be used to implement a computing device. One example of such a computing device can be a game device for providing multimedia experiences and playing video games that include an audio and video. Audio and video data tends to be deterministic, streaming and digital until reaching a digital to analog interface. Many of the concerns described above in the various testing steps are exacerbated with audio and video data. For example, many audio and video processing circuits process the data internally as digital data, but output the data on analog signals. Testing the analog signals at the output of a chip can be expensive and difficult to do, as described above. However, system 400 can be used for many other applications. System 400 includes a Central Processing Unit (CPU) 402, a graphics processor (also called a Northbridge) 404 and a Southbridge 406. CPU 402 and Northbridge 404 communicate with each other via a Front Side Bus (FSB). Northbridge 404 communicates with memory 410 via address control lines (Addr/cntl) and data lines (Data). Northbridge is used to provide graphics processing functions, provide memory functions, and serve as an intermediary between CPU 402 and Southbridge 406.

Northbridge 404 communicates with Southbridge 406 via a Backside Bus (BSB). Southbridge 406 performs various I/O functions, audio processing and testing functions. Southbridge 406 is in communication with I/O devices 420, hard disc drive and DVD drives 422, and flash memory 424. System 400 also includes video logic 412. Northbridge 404 communicates with video logic 412 via a Digital Video Output Bus (DVO). In one embodiment, video logic 412 includes one or more MISRs as discussed above. A circuit within Southbridge 406 acts as a test controller, including reading and recording the output signatures and IDs via the SMBus between Southbridge 406 and video logic 412. Video logic 412 also includes clock generation circuits which provide clocks to CPU 402, Northbridge 404 and Southbridge 406.

As discussed above, Southbridge 406 provides various audio processing. Southbridge communicates with digital to analog converters 426 via an I2S Bus. I2S is a standard digital audio chip-to-chip unidirectional interface. In its basic form, it consists of a sample clock (SCLK), a master clock (MCLK), a left/right indicator (LRSEL), and a serial data line. An interface 430 is included for connecting system 400 to components outside the system. Southbridge 406 is connected to interface 430 directly. In addition, digital analog converters 426 and video logic 412 are also connected to interface 430.

Figure 11:
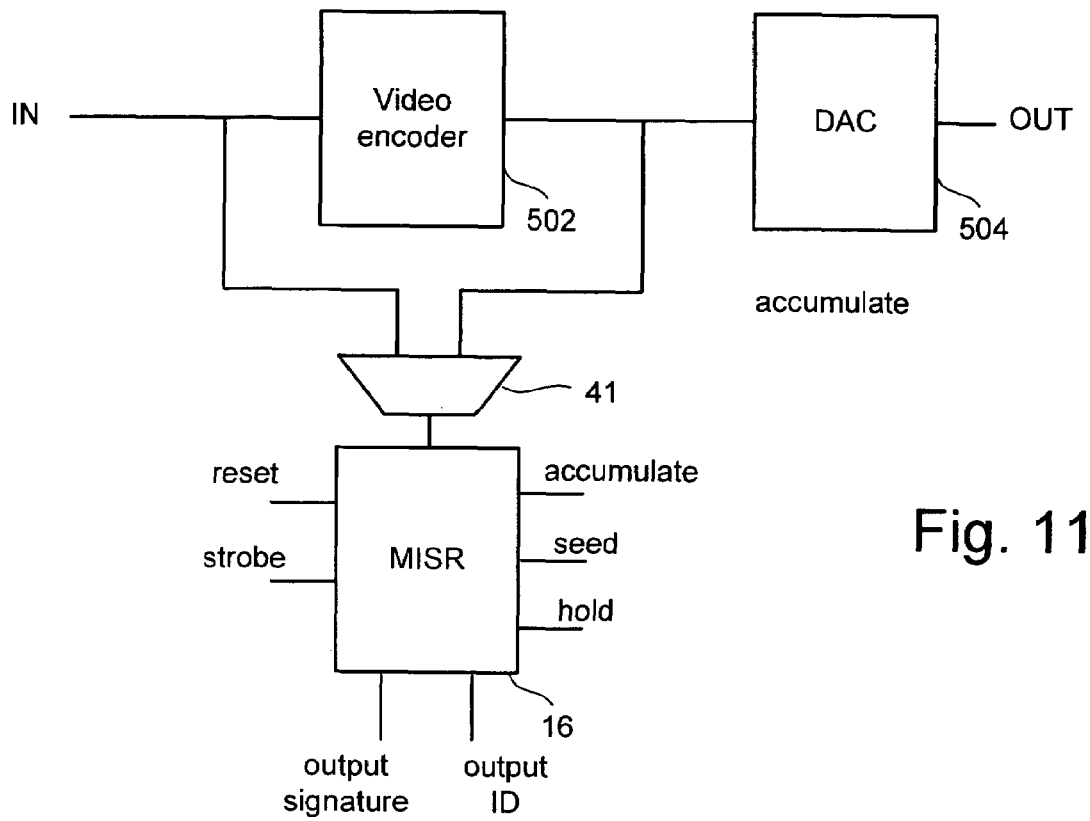
FIG. 11 is a block diagram depicting more detail of a portion of the Video Logic in the system of FIG. 10.

FIG. 11 is a block diagram describing more detail of some of the components of video logic 412, including a video encoder 502 providing output to a digital to analog converter 504. The output of digital to analog converter 504 leaves video logic chip 412 and is presented to interface 430. In one embodiment, a multiplexer 41 receives the inputs and outputs of video encoder 502. The output of the multiplexer is connected to the input[31:0] of MISR 16. In one embodiment, the output signature, output ID, accumulate signal, hold signal, multiplexer select signal and seed signal are all accessed by test controller logic in Southbridge 406 via the SMBus. The reset signal and strobe signal are provided by video encoder 502. For example, the strobe signal can be the Vsync signal which indicates a new field of data is being provided in NTSC video. In most digital video encoder implementations the number of samples between Vsync pulses is deterministic, a requirement of the strobe for this invention. In that case, the clock used for the MISR can be the pixel clock. In another embodiment, reset can be provided by the Southbridge or another device. In one embodiment, the video signal output from the video encoder 502 to digital to analog converter 504 is 30 bits. Therefore, misr[31] and misr[30] will not have an input bit to exclusive OR with misr[30] and misr[29], respectively.

Figure 12:
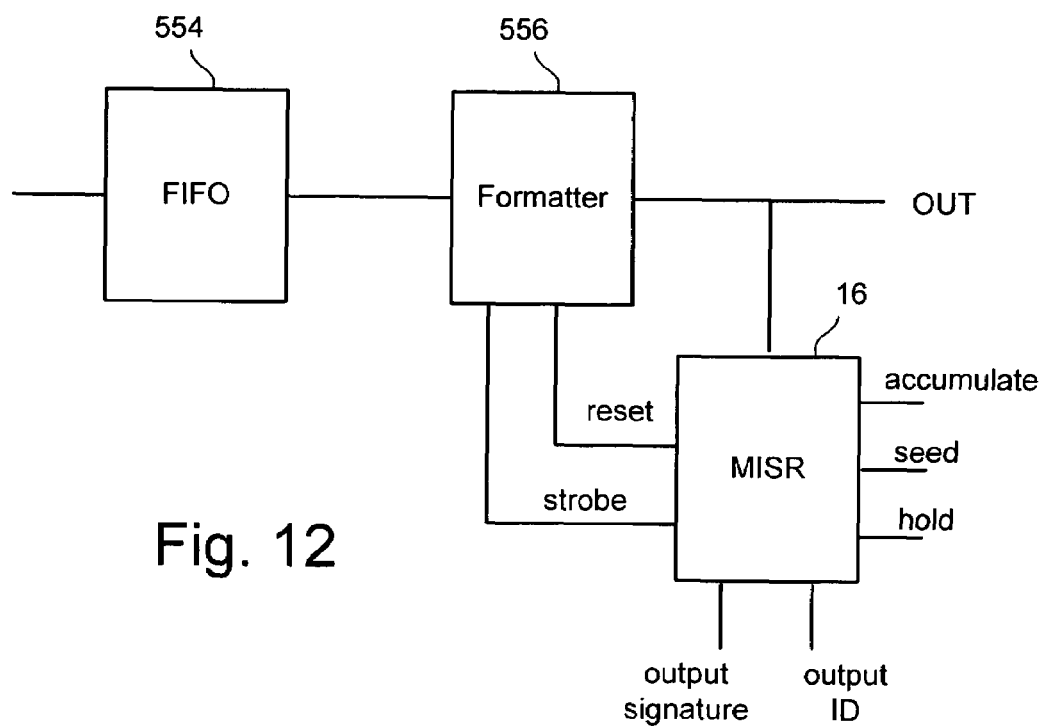
FIG. 12 is a block diagram depicting more detail of a portion of the Southbridge in the system of FIG. 10.

FIG. 12 provides more detail of some of the components of Southbridge 406. The output of an audio processing circuit on Southbridge 40 is stored in FIFO 554. One purpose of FIFO 554 is to transition data from one clock domain to the output clock domain. The output of FIFO 554 is provided to audio formatter 556, which formats the audio data for the appropriate output format desired by the system. The output of formatter 556 is presented to digital to analog converter 426 (see FIG. 10). In one embodiment, a MISR receives the output of formatter 556 as input data to be used to create the signatures.

The reset signal is provided to MISR 16 by formatter 556, as an indication to start creating signatures. In one embodiment, formatter 556 will deassert reset when the first real data is available. The strobe signals are provided by formatter 556. In one embodiment, formatter 556 uses an arbitrary block size so that the strobe signal is asserted periodically according to a timer. For example, the strobe signal can be asserted every 2.6 milliseconds. Other timing and block sizes can also be used. The output signature and output ID are provided to a register which is accessible by test controller logic on the Southbridge. The test controller logic can control the MISR accumulation, seed and hold signals. In one embodiment, the output of formatter 556 is two bit audio data. One of those bits will be input [0] of MISR 16 and the other bit will be input [1] of the MISR 16. The remaining bits of MISR 16 will not have an input signal to exclusive OR with the previous bit of the MISR.

One reason audio and video are mentioned specifically in the above examples is because they are deterministic and typically do not employ complex transmission protocols (no out of order transactions, 1 sample per clock, etc.), and because the digital values that drive the output digital to analog converters (the last point in the system in which a bit accurate (i.e. zero error) sampling can be made) are generally not accessible to test equipment during standard operation.

FIGS. 10-12 depict examples of one implementation that can use the MISR described above. These examples are not intended to limit the invention claimed herein. The MISR can be used in many different designs and for many different applications.

The strobe to latch the MISR can be asserted based on an external trigger (e.g., vsync) that may or may not be periodic, a number of samples (as for audio), or based on the content of the data itself. Regarding that latter, for a packet based interface the strobe could be generated whenever the packet header was detected.

An alternate MISR implementation can have a "valid data" indicator that is used to indicate when valid data is present on the input bus. This typically doesn't happen for audio and video, so it's not needed in the implementation of FIGS. 10-12, however, it can be useful for other interfaces. The basic idea is the that MISR register is only updated when valid data is present. You can envision this by changing the MISR register (register 60) to a register with enable and connect the enable signal to the OR of the strobe, the reset, and the data valid indicator. In such an implementation, the MISR would not be updated until valid data is present. In such an implementation, if reset or strobe was asserted while valid data was not present, it may be desirable to mask the input data bus when valid data is not present (i.e. place an AND before XOR 68A that has the data valid indicator and the input data as inputs). That way, if valid data was not present only 0 would be presented.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus for providing test information, comprising:
   a feedback shift register receiving input data, said feedback shift register includes first accumulation circuit elements receiving output of said feedback shift register; said feedback shift register includes a switch for choosing between results of said first accumulation circuit elements and a seed value;
   a first storage device in communication with said feedback shift register, said first storage device stores a state of said feedback shift register in response to a strobe signal received by the first storage device; and
   a number generation circuit, said number generation circuit outputs a new value in response to said strobe signal received by the number generation circuit.

2. An apparatus according to claim 1, wherein:
   said feedback shift register is a multiple input shift register; and
   said number generation circuit is a counter.

3. An apparatus according to claim 1, wherein:
   said strobe signal is an input provided by an external device.

4. An apparatus according to claim 1, wherein said feedback shift register further includes:
   storage elements providing said output of said feedback shift register; and
   second accumulation circuit elements receiving an output of said switch and said input data.

5. An apparatus according to claim 4, wherein:
   said first accumulation circuit elements include exclusive OR gates;
   said second accumulation circuit elements include exclusive OR gates; and
   a subset of said storage elements are provided with an exclusive OR of input data, an output of a respective neighboring storage element and an output of a last storage element.

6. An apparatus according to claim 1, wherein:
   said feedback shift register includes a set of storage elements, said first accumulation circuit elements receive data from said set of storage elements and said input data, said first accumulation circuit elements provide accumulated outputs to at least a subset of said storage elements;
   said first accumulation circuit elements combine said input data for a given storage element of said set of storage elements with stored data from a neighbor storage element of said set of storage elements; and
   said first accumulation circuit elements combine data from an end storage element of said set of storage elements with data from a subset of other storage elements of said set of storage elements.

7. An apparatus according to claim 1, further comprising:
   a second storage device having an input connected to said feedback shift register and an output connected to said first storage device, said second storage device stores said state of said feedback shift register during a first clock cycle, said first storage device stores said state of said feedback shift register during a clock cycle after said first clock cycle.

8. An apparatus according to claim 1, wherein:
   said first storage device receives an indication of a hold signal, said first storage device does not update if said hold signal is asserted.

9. An apparatus according to claim 1, further comprising:
   a second storage device in communication with said number generation circuit, said second storage device receives an indication of a hold signal, said second storage device is updated by an output of said number generation circuit if said hold signal is not asserted, said second storage device does not update if said hold signal is asserted, said first storage device does not update if said hold signal is asserted.

10. An apparatus according to claim 1, further comprising:
    a digital video processing circuit; and
    a digital to analog converter connected to an output of said digital video processing circuit, said feedback shift register is in communication with said digital video processing circuit to receive said output of said digital video processing circuit, said input data includes said output of said digital video processing circuit.

11. An apparatus according to claim 1, further comprising:
    an audio processing circuit, said feedback shift register is in communication with said audio processing circuit to receive said input data and said strobe signal from said audio processing circuit.

12. An apparatus according to claim 1, further comprising an external input for causing said switch to select between said results of said first accumulation circuit elements and said seed value.

13. An apparatus for providing test information, comprising:
    a feedback shift register receiving input data, said feedback shift register includes accumulation circuitry and storage elements, said accumulation circuitry receives data from said storage elements, said input data, and a seed value, said accumulation circuitry provides accumulated outputs to at least a subset of said storage elements, said feedback shift register has a switch for choosing between said between a result of said accumulation circuitry and a non-zero seed value, an output of said switch is connected to said accumulation circuitry;
    a first storage device in communication with said storage elements, said first storage device stores data from said storage elements in response to a strobe signal; and
    an identification generation circuit, said identification generation circuit provides a new identification in response to said strobe signal.

14. An apparatus according to claim 13, wherein:
    said identification generation circuit is a counter;
    said first storage device is a register;
    said accumulation circuitry includes one or more exclusive OR gates, said one or more exclusive OR gates combine said input data with data from neighboring storage elements and data from an end storage element to create one or more of said accumulated outputs;
    said feedback shift register is a multiple input shift register; and
    said apparatus further comprises a second storage device having an input connected to said storage elements and an output connected to said first storage device.

15. An apparatus according to claim 14, further comprising:
    a third storage device in communication with said counter, said third storage device receives an indication of a hold signal, said third storage device is updated by an output of said counter if said hold signal is not asserted, said third storage device does not update if said hold signal is asserted, said first storage device does not update if said hold signal is asserted.

16. An apparatus according to claim 13, further comprising:
a digital video processing circuit; and
a digital to analog converter connected to an output of said digital video processing circuit, said accumulation circuitry is in communication with said digital video processing circuit to receive said output of said digital video processing circuit, said input data includes said output of said digital video processing circuit, said feedback shift register receives a video image synchronization signal from said digital video processing circuit, said video image synchronization signal is said strobe signal.

17. An apparatus according to claim 13, further comprising:
an audio processing circuit, said accumulation circuitry is in communication with said audio processing circuit to receive said input data from said audio processing circuit.

18. An apparatus according to claim 13, further comprising:
a multiplexer, said multiplexer has multiple inputs connected to different functions, said multiplexer has an output connected to said feedback shift register for providing said input data to said feedback shift register.

19. An apparatus according to claim 13, wherein said accumulation circuitry receives feedback from selected ones of said storage elements.

20. A method for providing test data, comprising:
receiving data values;
accumulating said data values using a shift register with feedback to create running signatures;
providing a subset of said signatures to an output;
providing identifications for signatures in said subset, each of said signatures in said subset has associated therewith an identification of said provided identification, said steps of receiving data values, accumulating, providing a subset and providing identifications are part of a first test run that results in a first set of signatures and identifications; and
said method further comprises performing a second test run that results in a second set of signatures and associated identifications, and verifying that a particular signature from said first set of signatures is the same as a signature from said second set of signatures that has an identification matching an identification corresponding to said signature from said first set of signatures.

21. A method according to claim 20, wherein:
said providing of said subset of said signatures to said output includes separately providing each signature of said subset in response to a strobe signal and holding each signature of said subset while said shift register creates additional signatures; and
said providing identifications includes separately providing a new identification in response to said strobe signal.

22. A method according to claim 20, further comprising:
receiving a hold command; and
freezing said output in response to said hold command despite said strobe signal indicating that additional signatures should be provided to said output.

23. A method according to claim 20, wherein:
said data values include video data from a video processing circuit; and
said strobe signal is a video image synchronization signal from said video processing circuit.

24. A method according to claim 20, wherein:
said data values include audio data from an audio processing circuit; and
said strobe signal is a periodic timing signal from said audio processing circuit.

25. A method according to claim 20, wherein:
said shift register is a multiple input shift register.

26. A method according to claim 20, wherein:
said accumulating said data values includes operating on all of said data values using a pseudo random sequence based on contents of said shift register.

27. A method according to claim 20, wherein:
said providing said subset of said signatures to said output includes storing a particular signature while said shift register continues to update to new signatures.

28. A method according to claim 20, further comprising:
receiving a programmable seed value; and
loading said programmable seed value into said shift register by combining said seed value with new input data using an exclusive OR operation.

29. A method according to claim 20, further comprising:
receiving a start signal, said step of providing identifications is performed after said receiving of said start signal.

30. A method according to claim 20, further comprising:
receiving an indication whether to reset said shift register using a programmable seed value;
receiving said programmable seed value and resetting said shift register using said programmable seed value if said indication indicates to reset said shift register; and
receiving and accumulating subsequent data values without resetting said shift register if said indication does not indicate to reset said shift register.

31. A method according to claim 20, wherein:
said step of receiving data values includes receiving data from multiple circuit blocks and choosing data from one of said circuit blocks.

32. A method for providing test data, comprising:
receiving a data value;
accumulating said data value with contents of a stored accumulation of one or more past values to create running signatures;
receiving a request regarding whether or not to hold said stored accumulation at an output while accumulating one or more new data values;
receiving an indication of whether to reset using a programmable seed value;
receiving said programmable seed value and resetting using said programmable seed value if said indication indicates to reset;
providing an identification for each signature of the running signatures; and
receiving and accumulating subsequent data values without using said programmable seed value if said indication does not indicate to reset.

33. A method according to claim 32, wherein:
said step of accumulating said data value is performed by a multiple input shift register; and
said step of accumulating said data value includes operating on said data value using a pseudo random value based on contents of said multiple input shift register.

34. A method according to claim 32, wherein:
for a first subset of one or more bits of said multiple input shift register, said step of accumulating said data value includes performing an exclusive OR operation for a bit of input data, a neighbor bit and a last bit of said multiple input shift register; and for a second subset of one or more bits of said multiple input shift register, said step of accumulating said data value includes performing an exclusive OR operation for only a bit of input data and a neighbor bit of said multiple input shift register.

35. A method for providing test data, comprising:

receiving data values;

accumulating said data values into a storage device to create running signatures;

receiving sampling requests;

updating an output based on said running signatures in response to said sampling requests;

receiving a hold command;

providing an identification for each signature of the running signatures; and in response to said hold command, freezing said output despite receiving further sampling requests.

36. A method according to claim 35, wherein:

said step of updating an output includes storing a signature in a register.

37. A method according to claim 35, wherein:

said storage device is part of a multiple input shift register; and said step of accumulating includes operating on said data values using a pseudo random value based on contents of said multiple input shift register.

* * * * *